United States Patent
Campbell et al.

(10) Patent No.: US 7,660,121 B2
(45) Date of Patent: Feb. 9, 2010

(54) SYSTEM OF FACILITATING COOLING OF ELECTRONICS RACKS OF A DATA CENTER EMPLOYING MULTIPLE COOLING STATIONS

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/274,459

(22) Filed: Nov. 20, 2008

(65) Prior Publication Data

US 2009/0122487 A1 May 14, 2009

Related U.S. Application Data

(63) Continuation of application No. 11/744,269, filed on May 4, 2007, now Pat. No. 7,477,514.

(51) Int. Cl.
*H05K 7/20* (2006.01)
(52) U.S. Cl. ............... 361/698; 361/696; 361/699; 361/679.53; 165/80.4; 165/80.5; 62/259.2

(58) Field of Classification Search ............ 361/679.46, 361/679.47, 679.53, 695–699, 724, 727, 361/730; 165/80.4, 80.5, 104.33, 104.34, 165/185, 121–126, 104.21; 62/259.2, 259.1, 62/267, 440, 441; 312/223.1, 223.2, 223.3, 312/198, 199, 201, 334.24, 334.25; 454/184
See application file for complete search history.

(56) References Cited

U.S. PATENT DOCUMENTS 5,718,628 A  2/1998  Nakazato et al.

(Continued)

*Primary Examiner*—Michael V Datskovskiy
(74) *Attorney, Agent, or Firm*—Geraldine Monteleone, Esq.; Kevin P. Radigan, Esq.; Heslin Rothenberg Farley & Mesiti, P.C.

(57) ABSTRACT

A cooling system and method are provided for cooling air exiting one or more electronics racks of a data center. The cooling system includes at least one cooling station separate and freestanding from at least one respective electronics rack of the data center, and configured for disposition of an air outlet side of electronics rack adjacent thereto for cooling egressing air from the electronics rack. The cooling station includes a frame structure separate and freestanding from the respective electronics rack, and an air-to-liquid heat exchange assembly supported by the frame structure. The heat exchange assembly includes an inlet and an outlet configured to respectively couple to coolant supply and coolant return lines for facilitating passage of coolant therethrough. The air-to-liquid heat exchange assembly is sized to cool egressing air from the air outlet side of the respective electronics rack before being expelled into the data center.

14 Claims, 15 Drawing Sheets

U.S. PATENT DOCUMENTS

| | | |
|---|---|---|
| 5,967,346 A | 10/1999 | Price |
| 6,305,180 B1 | 10/2001 | Miller et al. |
| 6,374,627 B1 | 4/2002 | Schumacher et al. |
| 6,557,357 B2 | 5/2003 | Spinazzola et al. |
| 6,634,615 B1 | 10/2003 | Bick et al. |
| 6,775,137 B2 * | 8/2004 | Chu et al. .................. 361/696 |
| 6,862,179 B2 | 3/2005 | Beitelmal et al. |
| 6,973,801 B1 | 12/2005 | Campbell et al. |
| 7,046,514 B2 | 5/2006 | Fink et al. |
| 7,051,946 B2 | 5/2006 | Bash et al. |
| 7,057,506 B2 | 6/2006 | Bash et al. |
| 7,088,585 B2 | 8/2006 | Chu et al. |
| 7,106,590 B2 | 9/2006 | Chu et al. |
| 7,315,448 B1 | 1/2008 | Bash et al. |
| 7,349,213 B2 | 3/2008 | Campbell et al. |
| 2005/0061013 A1 * | 3/2005 | Bond ...................... 62/259.2 |
| 2005/0235671 A1 | 10/2005 | Belady et al. |
| 2005/0237716 A1 | 10/2005 | Chu et al. |
| 2006/0065000 A1 | 3/2006 | Belady |
| 2006/0232945 A1 | 10/2006 | Chu et al. |
| 2006/0250770 A1 | 11/2006 | Campbell et al. |
| 2007/0019380 A1 | 1/2007 | Campbell et al. |

\* cited by examiner

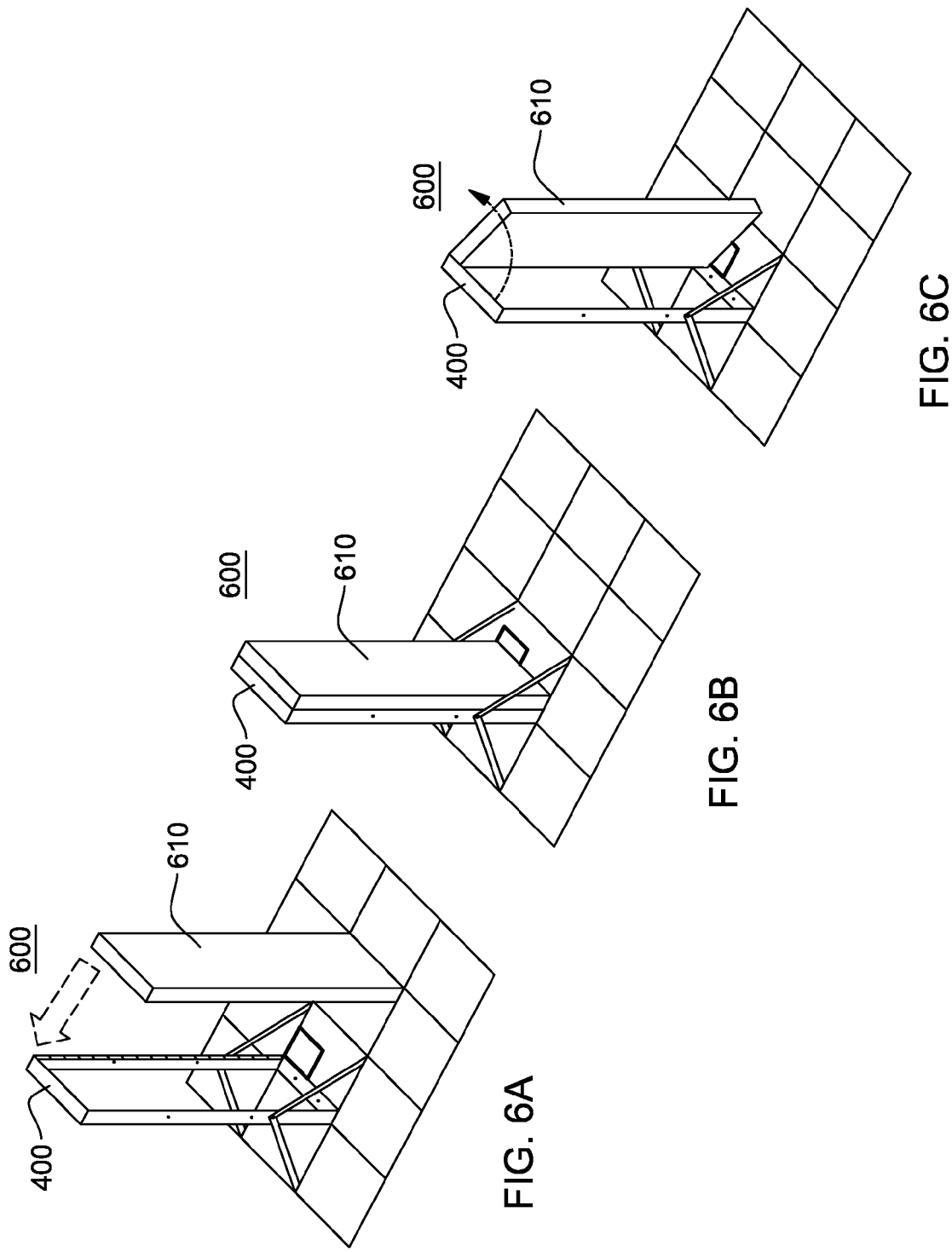

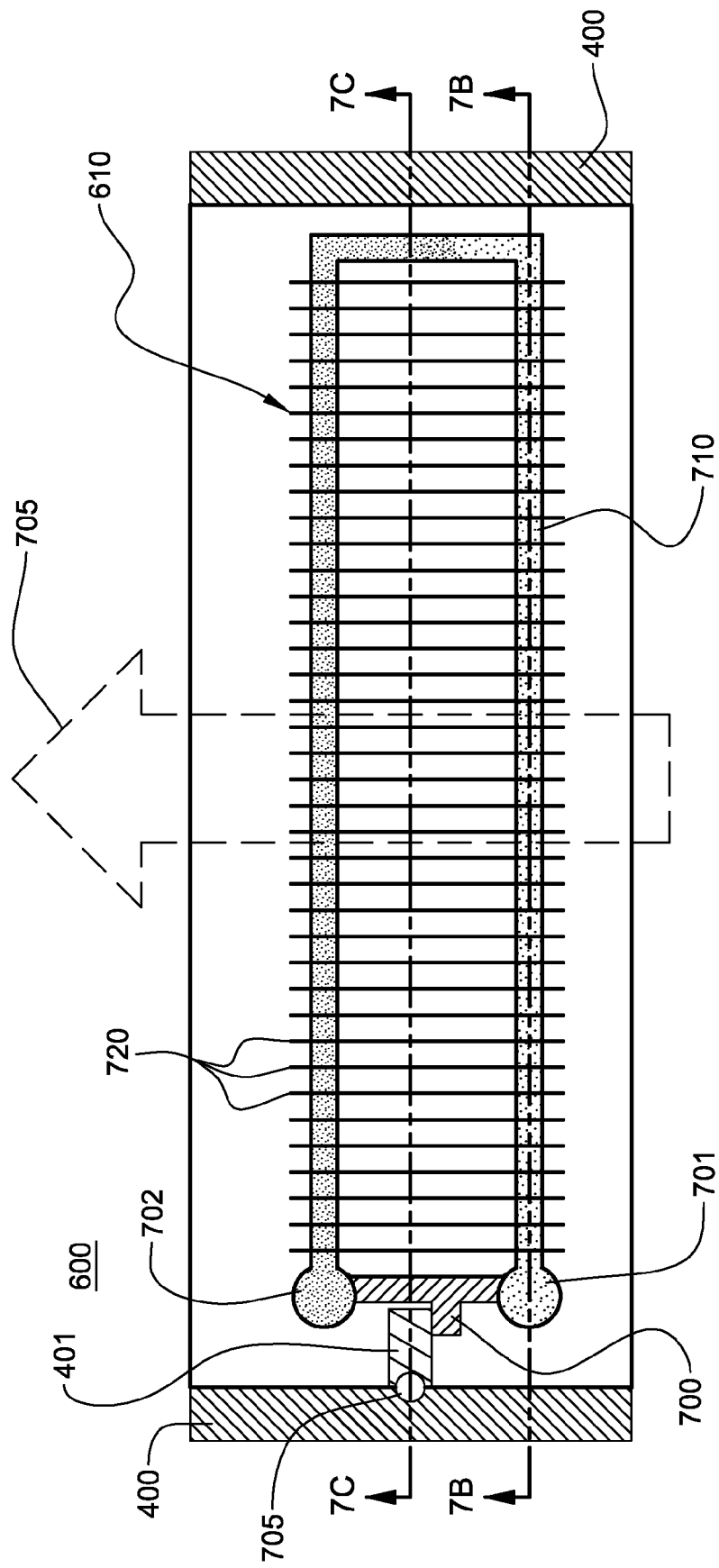

SYSTEM OF FACILITATING COOLING OF ELECTRONICS RACKS OF A DATA CENTER EMPLOYING MULTIPLE COOLING STATIONS

CROSS-REFERENCE TO RELATED APPLICATION

This application is a continuation of co-pending U.S. patent application Ser. No. 11/744,269, filed May 4, 2007, entitled "System and Method of Facilitating Cooling of Electronics Racks of a Data Center Employing Multiple Cooling Stations", by Campbell et al., the entirety of which is hereby incorporated herein by reference.

TECHNICAL FIELD OF THE INVENTION

The present invention relates in general to systems and methods for facilitating cooling of rack-mounted assemblages of individual electronics units, such as rack-mounted computer server units.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of the air that is exhausted into the computer center.

In many large server applications, processors along with their associated electronics (e.g., memory, disk drives, power, etc.) are packaged in removable drawer configurations stacked within a rack or frame. In other cases, the electronics may be in fixed locations within the rack or frame. Typically, the components are cooled by air moving in parallel air flow paths, usually front-to-back, impelled by one or more air moving devices (e.g., fans or blowers). In some cases it may be possible to handle increased power dissipation within a single drawer by providing greater air flow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the ability of the room air-conditioning to effectively handle the load. This is especially true for large installations with "server farms" or large banks of computer racks close together. In such installations not only will the room air-conditioning be challenged, but the situation may also result in recirculation problems with some fraction of the "hot" air exiting one rack unit being drawn into the air inlet of the same rack or a nearby rack. This recirculating flow is often extremely complex in nature, and can lead to significantly higher rack inlet temperatures than expected. This increase in cooling air temperature may result in components exceeding their allowable operating temperature and in a reduction in long term reliability of the components.

Thus, there is a need in the art for a system and method for further facilitating cooling of rack-mounted electronics units, particularly in a large computer room installation traditionally relying on one or more room air-conditioning units to cool the electronics racks.

SUMMARY OF THE INVENTION

The shortcomings of the prior art overcome and additional advantages are provided through the provision of a cooling system for facilitating cooling of an electronics rack. The cooling system includes at least one cooling station for cooling at least one electronics rack of a data center. Each electronics rack of the at least one electronics rack includes an air inlet side and an air outlet side. The air inlet and air outlet sides of the electronics rack respectively enable ingress and egress of external air. Each cooling station of the at least one cooling station is separate and freestanding from at least one respective electronics rack when the at least one electronics rack is in operative position adjacent thereto, and is configured for disposition of the air outlet side of the at least one respective electronics rack adjacent thereto for cooling egressing air therefrom. The cooling station includes a frame structure separate and freestanding from the at least one respective electronics rack; an air-to-liquid heat exchange assembly supported by the frame structure, the air-to-liquid heat exchange assembly including an inlet configured to couple to a coolant supply line and an outlet configured to couple to a coolant return line to facilitate passage of coolant there through; and wherein the air-to-liquid heat exchange assembly is sized to cool egressing air from the air outlet side of the at least one respective electronics rack before being expelled into the data center.

In another aspect, a data center is provided which includes multiple electronics racks and a cooling system for cooling the multiple electronics racks. Each electronics rack includes an air inlet side and an air outlet side, with the air inlet and air outlet sides respectively enabling ingress and egress of external air. The cooling system includes multiple cooling stations, which are separate and freestanding from the multiple electronics racks. The multiple electronics racks are disposed with the air outlet sides thereof adjacent to the multiple cooling stations for facilitating cooling of egressing air therefrom. Each cooling station further includes a frame structure separate and freestanding from at least one respective electronics rack, and an air-to-liquid heat exchange assembly supported by the frame structure. The air-to-liquid heat exchange assembly includes an inlet coupled to a coolant supply line and an outlet coupled to a coolant return line for facilitating passage of coolant therethrough. The air-to-liquid heat exchange assembly substantially covers the air outlet side of at least one respective electronics rack, with air egressing therefrom passing through the air-to-liquid heat exchange assembly before being expelled into the data center environment.

In a further aspect, a method of facilitating cooling of an electronics rack is provided. The method includes: providing a cooling station configured for disposition of an air outlet side of an electronics rack adjacent thereto for cooling egressing air from the electronics rack. When operational, air moves through the electronics rack from an air inlet side to an air outlet side thereof and then through the cooling station disposed adjacent to the air outlet side of the electronics rack. The cooling station is separate and freestanding from the electronics rack, and includes: a frame structure separate and freestanding from the electronics rack; an air-to-liquid heat exchange assembly supported by the frame structure, the air-to-liquid heat exchange assembly including an inlet configured to couple to a coolant supply line and an outlet configured to couple to a coolant return line to facilitate passage of coolant therethrough; and wherein the air-to-liquid heat exchange assembly is sized to cool egressing air from the air outlet side of the electronics rack before being expelled into a data center.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 6A depicts installation of an air-to-liquid heat exchange assembly onto one frame structure of FIG. 5, in accordance with an aspect of the present invention;

FIG. 6B illustrates one embodiment of the resultant cooling station achieved by affixing the air-to-liquid heat exchange assembly to the frame structure in FIG. 6A, in accordance with an aspect of the present invention;

FIG. 6C depicts the cooling station of FIG. 6B showing the air-to-liquid heat exchange assembly pivoted open, in accordance with an aspect of the present invention;

FIG. 7A is a cross-sectional plan view of one embodiment of a cooling station for a liquid-cooled data center, in accordance with an aspect of the present invention;

DETAILED DESCRIPTION OF THE INVENTION

As used herein, the terms "electronics rack", "rack-mounted electronic equipment", and "rack unit" are used interchangeably, and include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics drawers each having one or more heat generating components disposed therein requiring cooling. Further, as used herein, "air-to-liquid heat exchange assembly" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling fins. Additionally, size, configuration and construction of the air-to-liquid heat exchange assembly and/or air-to-liquid heat exchanger thereof as described herein below can vary without departing from the scope of the present invention. Further, "data center" refers to a computer installation containing one or more electronics racks to be cooled. As a specific example, a data center may include one or more rows of rack-mounted computing units, such as server units.

Reference is made below to the drawings, which are not drawn to scale and are simplified for ease of understanding, wherein the same reference numbers used throughout different figures designate the same or similar components.

As noted initially, advances in semiconductor technology have led to an exponential increase in processor performance over the last few years. This in turn has led to a steep increase in the node, rack and cluster power consumption, leading to a corresponding rise in the energy needs of the air-cooling HVAC equipment used for thermal management in a typical data center. These heat dissipation trends have also resulted in significant cooling challenges due to localized hot spots in high density data centers.

Figure 1:
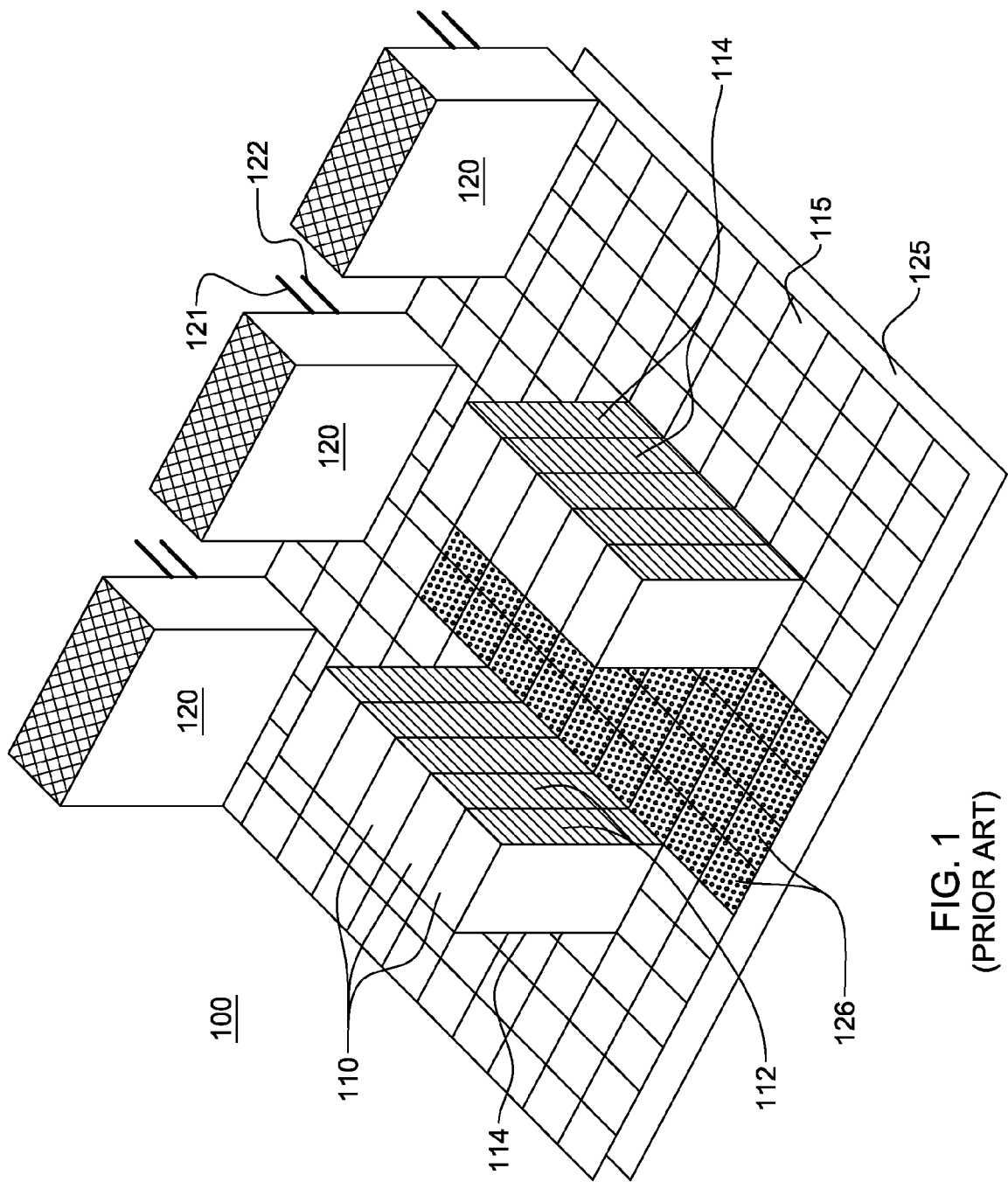
FIG. 1 depicts one embodiment of a conventional raised floor layout of an air-cooled data center.

FIG. 1 illustrates one embodiment of an air-cooled data center, generally denoted 100, wherein a plurality of electronics racks 110 are disposed in multiple rows on a raised floor region 115 of the data center. Within air-conditioning units 120, air-to-liquid heat exchangers cool the room's ambient air transferring heat therefrom to facility coolant passing through the air-conditioning units 120, which are shown connected to facility coolant inlet line 121 and facility coolant outlet line 122. In data center 100, electronics rack 110 are aligned in rows with air inlet sides 112 of the racks disposed adjacent to perforated tiles 126, which allow cool air to be drawn into the inlet sides of the electronics racks from an under-floor plenum 125 of raised floor region 115. Heat is exhausted out the air outlet sides 114 of the electronics racks into the data center environment. Typically, the electronics racks include one or more air moving devices which facilitate the ingress and egress of air flow from the air inlet side to the air outlet side thereof. Heat expelled into the data center environment exits through the air-conditioning units 120.

The limiting factors for air-cooled data centers relate to the maximum chilled air that can be supplied from a single perforated tile, the maximum cooling capabilities of each air-conditioning unit, and a hot air recirculation phenomenon that is common in these systems. Hot air recirculation occurs when the total supplied chilled air at the rack inlet is less than the total rack airflow rate, leading to the hot exhaust air from one electronics rack being drawn into the air inlet side of the same or another electronics rack, thus resulting in unacceptably high air inlet temperatures.

The re-circulation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 10-35° C. range. For a raised floor layout such as depicted in FIG. 1, however, temperatures can range from 15-20° C. at the lower portion of the rack, close to the cooled air input floor vents, to as much as 45-50° C. at the upper portion of the electronics rack, due to hot air recirculation.

Thus, the state-of-the-art air-cooled data centers may have a number of disadvantages, which are to be addressed by the concepts presented herein. These disadvantages include a moderate allowable server density, and therefore a lower allowable floor heat flux; a high energy consumption; high space requirements, and thus higher total cost of ownership; high noise generation due to the power blowers in the computer room air-conditioning units being disposed within the data center; and varying electronic reliability due to uneven intake temperatures.

Figure 2:
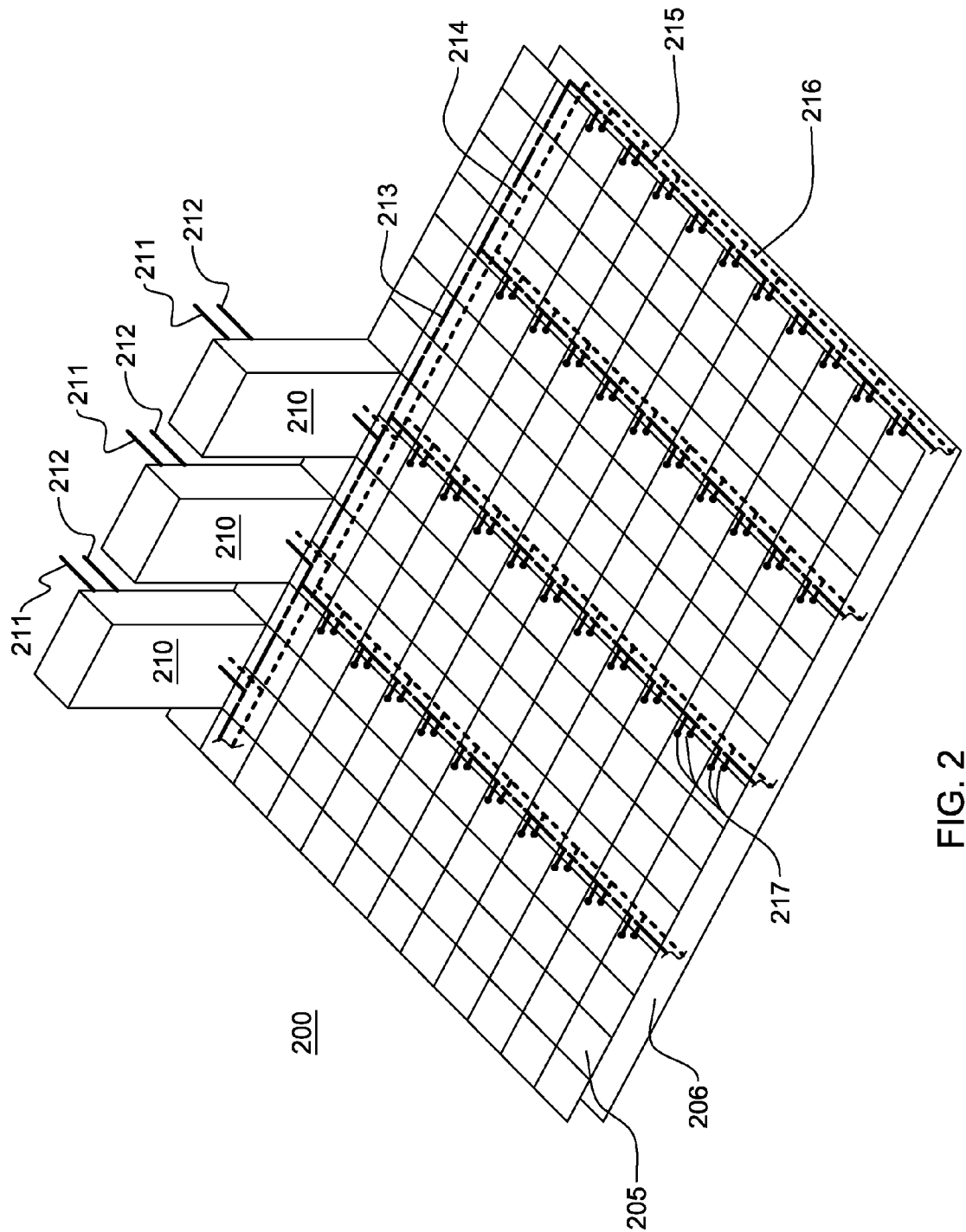
FIG. 2 is a partial embodiment of a layout of a liquid-cooled data center employing a cooling system, in accordance with an aspect of the present invention.

FIG. 2 depicts one embodiment of a liquid-cooled data center (in accordance with an aspect of the present invention), shown without the electronics racks and cooling stations to cool the electronics racks. One or more coolant distribution units (CDUs) 210 reside on a floor 205, which again may be a raised floor region of data center 200. Each coolant distribution unit 210 includes at least one liquid-to-liquid heat exchanger which transfers heat from a system side to a facility side thereof. As used herein, "facility water" or "facility coolant" refers to the facility water or coolant, while "system water" or "system coolant" refers to the cooled/conditioned water or coolant, respectively, circulating between the coolant distribution units and the respective cooling stations (described below). One example of facility side or system side coolant is water. However, the concepts disclosed herein are readily adapted to use with other types of coolant on both the facility side and the system side. For example, either coolant may comprise a brine, a fluorocarbon liquid, or other similar chemical coolant or a refrigerant, while still maintaining the advantages and unique features of the present invention. In an alternate embodiment of a liquid-cooled data center, no coolant distribution units are employed. In this embodiment, the system coolant is the facility coolant, which is fed directly to the cooling stations of the liquid-cooled data center, for example, through the supply and return headers discussed below with reference to the liquid-cooled data center embodiment of FIG. 2.

In addition to coolant distribution units 210, the cooling system for the liquid-cooled data center of FIG. 2 includes a primary supply header 213 and a primary return header 214, as well as multiple secondary supply headers 215 and secondary return headers 216 extending from the primary headers. As shown in the depicted embodiment, these headers are disposed within the floor plenum 206 defined below raised floor 205 of data center 200. Quick connect couplings 217 are provided for connecting individual cooling stations to the secondary supply and return headers 215, 216. The quick connect couplings 217 define a relatively dense grid of coupling connections mounted to the secondary supply and return headers, through which system water is supplied and returned.

The three coolant distribution units (CDUs) 210 illustrated by FIG. 2 are presented by way of example only. In certain implementations, one CDU may be employed, while in others two or more than three may be utilized. As noted, the coolant distribution unit includes a liquid-to-liquid heat exchanger, which in one example, receives 5-10° C. facility water from a facility chiller plant (not shown) and cools the system water to a temperature in the range of 12-20° C., in order to remain above the room dew point temperature. In addition to a liquid-to-liquid heat exchanger, each CDU may include one or more of a power/control element, a reservoir/expansion tank, a pump, facility water inlet and outlet pipes 211, 212, a system coolant supply plenum and a system coolant return plenum. Further, each CDU may be designed with multiple coolant pumps for redundancy, as well as more sophisticated control algorithms.

Figure 3:
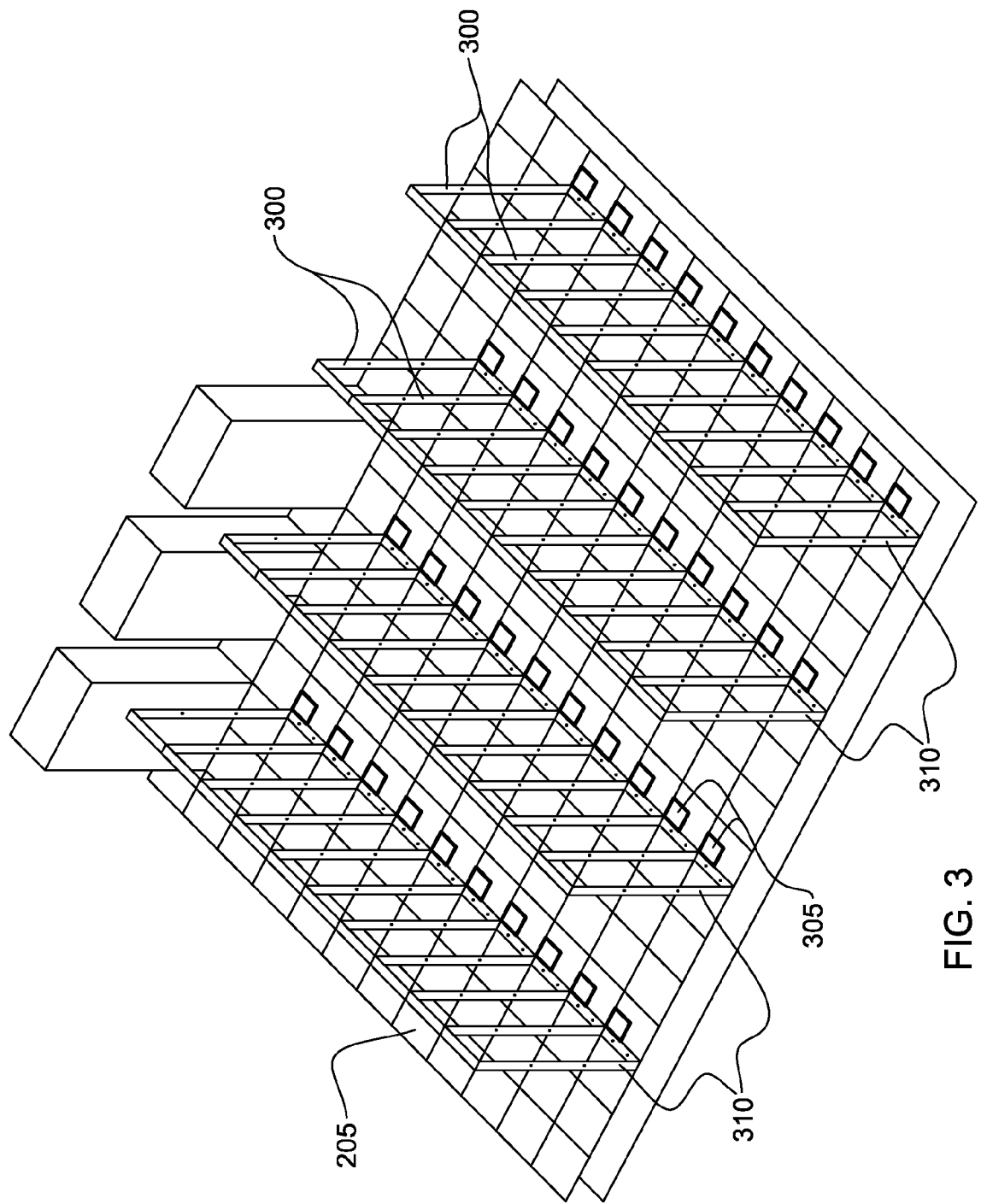
FIG. 3 depicts the liquid-cooled data center of FIG. 2 with one embodiment of a plurality of frame structures of the cooling system shown aligned in rows, in accordance with an aspect of the present invention.

FIG. 3 depicts the liquid-cooled data center of FIG. 2 shown with the addition of a plurality of frame structures 300 secured to the raised floor 205 in multiple rows 310. In one embodiment, frame structures 300 are fabricated of steel and are rigidly bolted to the raised floor and to each other to form the illustrated cooling station superstructures. In the embodiment, adjacent to each frame structure 300 is an opening 305 in raised floor 205 to facilitate plumbing and cable connections, for example, to the respective electronics rack and cooling station (described further below). Openings 305 allow the air-to-liquid heat exchange assemblies of the cooling stations to be fluidically coupled to the secondary supply and return headers depicted in FIG. 2.

Figure 4A:
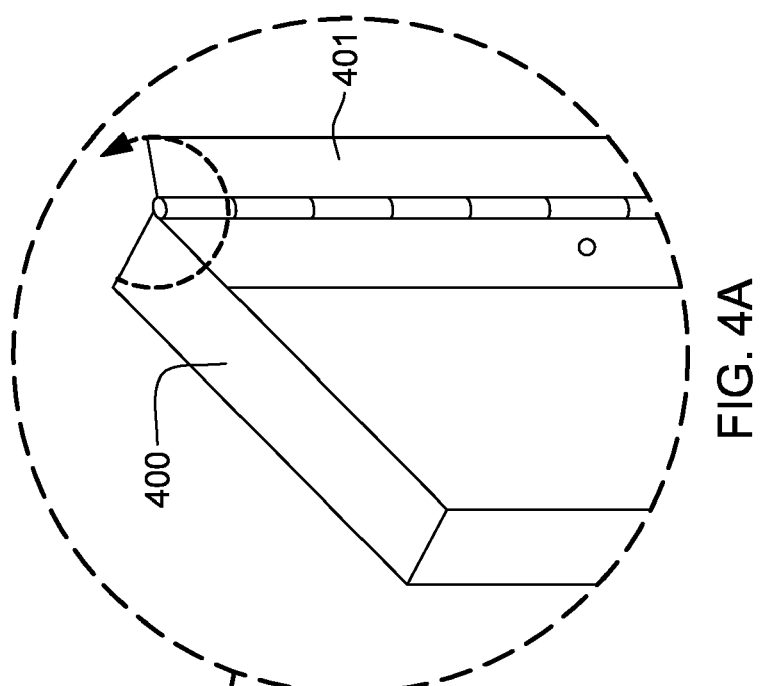
FIG. 4A is a partial enlargement of the frame structure of FIG. 4, taken within circle 4A, and illustrating the hinged flap in rotation, in accordance with an aspect of the present invention.
Figure 4:
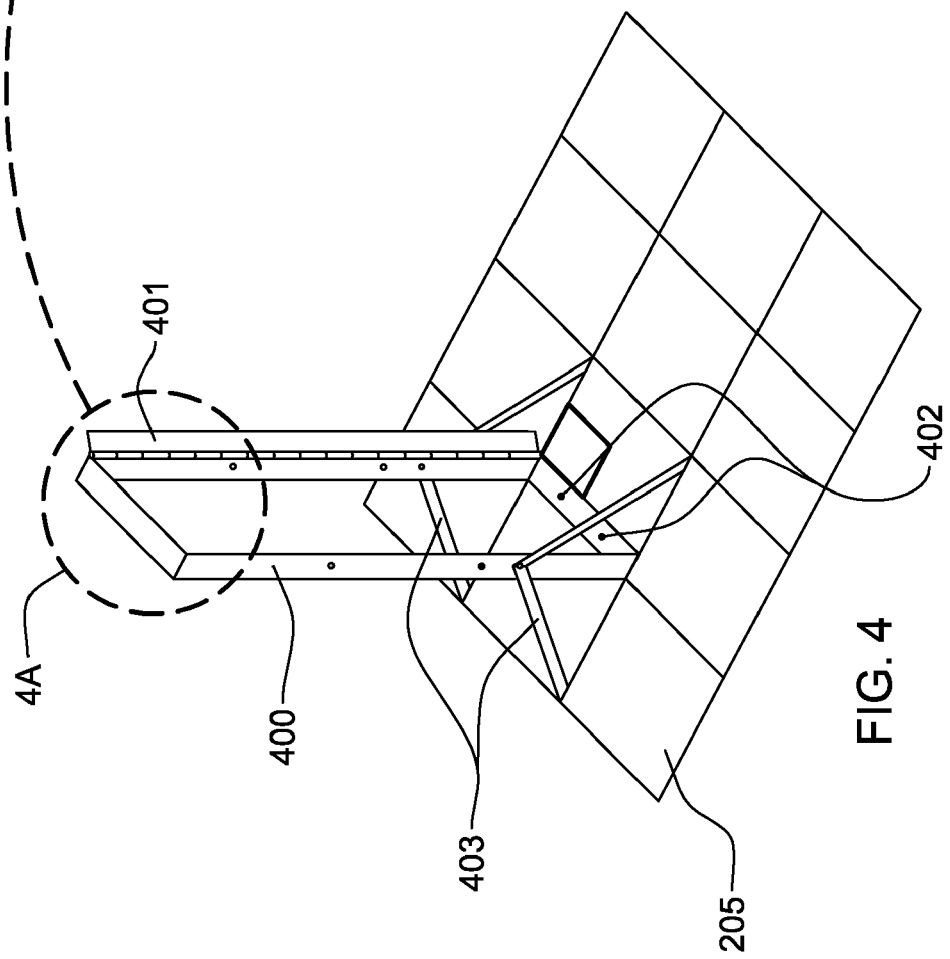
FIG. 4 depicts a further embodiment of the frame structures of FIG. 3 shown separate and freestanding within the data center, and illustrating a hinged flap attached to one edge thereof, in accordance with an aspect of the present invention.

FIG. 4 illustrates one embodiment of an augmented frame structure 400 to form a portion of a cooling station of a cooling system as described herein. As shown, this frame structure is augmented with a hinged flap 401 on one edge thereof which is to facilitate the hinged attachment of an air-to-liquid heat exchange assembly thereto. FIG. 4A depicts rotation of this hinged flap 401 relative to frame structure 400. As shown in FIG. 4, frame structure 400 is bolted 402 to raised floor 205, as well as to one or more adjacent frame structures (such as shown in FIG. 3). The frame structure is further augmented by the addition of struts 403 which are also attached to raised floor 205 to enhance strength and rigidity of the freestanding frame structure. In an alternate embodiment, the frame structure may be augmented by the addition of struts secured to a ceiling of the data center, or alternatively, to one or more walls of the data center.

Figure 5:
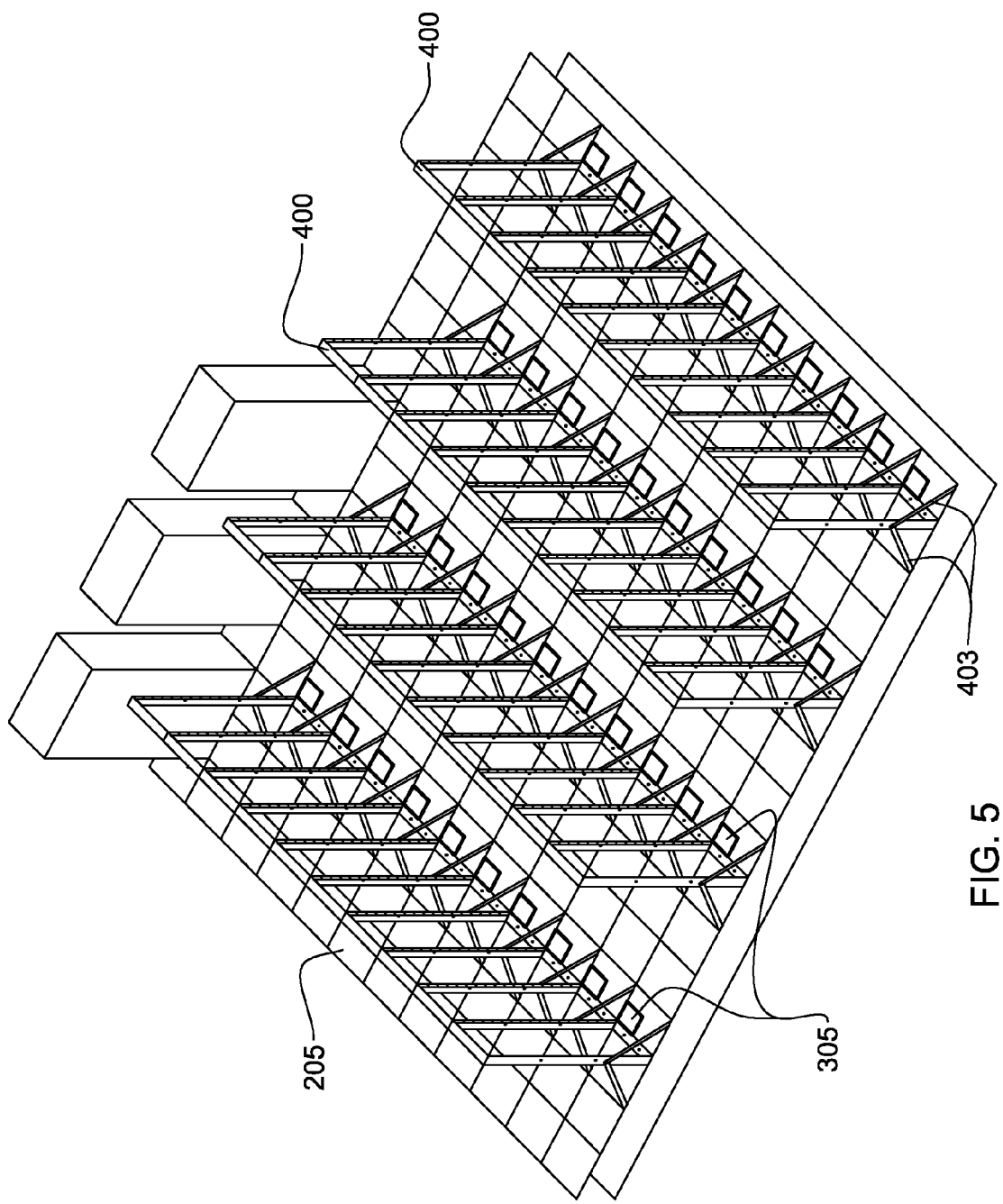
FIG. 5 depicts the liquid-cooled data center of FIG. 2, with a plurality of frame structures as depicted in FIG. 4 disposed in multiple rows within the data center, in accordance with an aspect of the present invention.

FIG. 5 depicts the liquid-cooled data center of FIG. 3, but with the augmented frame structure 400 of FIGS. 4 & 4A propagated throughout the rows of support structures. Note that in this embodiment, each augmented frame structure 400 is again shown bolted to raised floor 205 with an opening 305 disposed adjacent thereto for facilitating plumbing and cabling connections. Struts 403 of the augmented frame structures 400 (in this embodiment) are shown shared between adjoining frame structures. Note also that in other implementations, one or more of struts 403 may be removed if unneeded for the rigidity and strength of the superframe structure(s) desired.

FIGS. 6A-6C illustrate assembly of a cooling station, in accordance with an aspect of the present invention. As shown in FIG. 6A, an air-to-liquid heat exchange assembly 610 is sized and configured to mount to hinged flap 401 (FIG. 4A) of augmented frame structure 400. FIG. 6B illustrates the assembled cooling station 600, including frame structure 400 and air-to-liquid heat exchange assembly 610 supported by the frame structure. In FIG. 6C, air-to-liquid heat exchange assembly 610 of cooling station 600 is rotated open, for example, to access the air outlet side of an adjacent electronics rack (as shown in FIG. 10). Note that in this embodiment, air-to-liquid heat exchange assembly 610 is sized to substantially cover the air outlet side of at least one respective electronics rack (see FIG. 9), wherein substantially all air egressing the air outlet side thereof passes through the air-to-liquid heat exchange assembly for extraction of heat before being expelled into the data center room. The one-to-one correlation of cooling station to electronics rack (e.g., illustrated in FIG. 9) is provided by way of example, only. In another implementation, multiple cooling stations may be employed to cover the air outlet side of a single respective electronics rack, or still further, one cooling station may cover the air outlet side of more than one respective electronics rack.

Figure 7B:
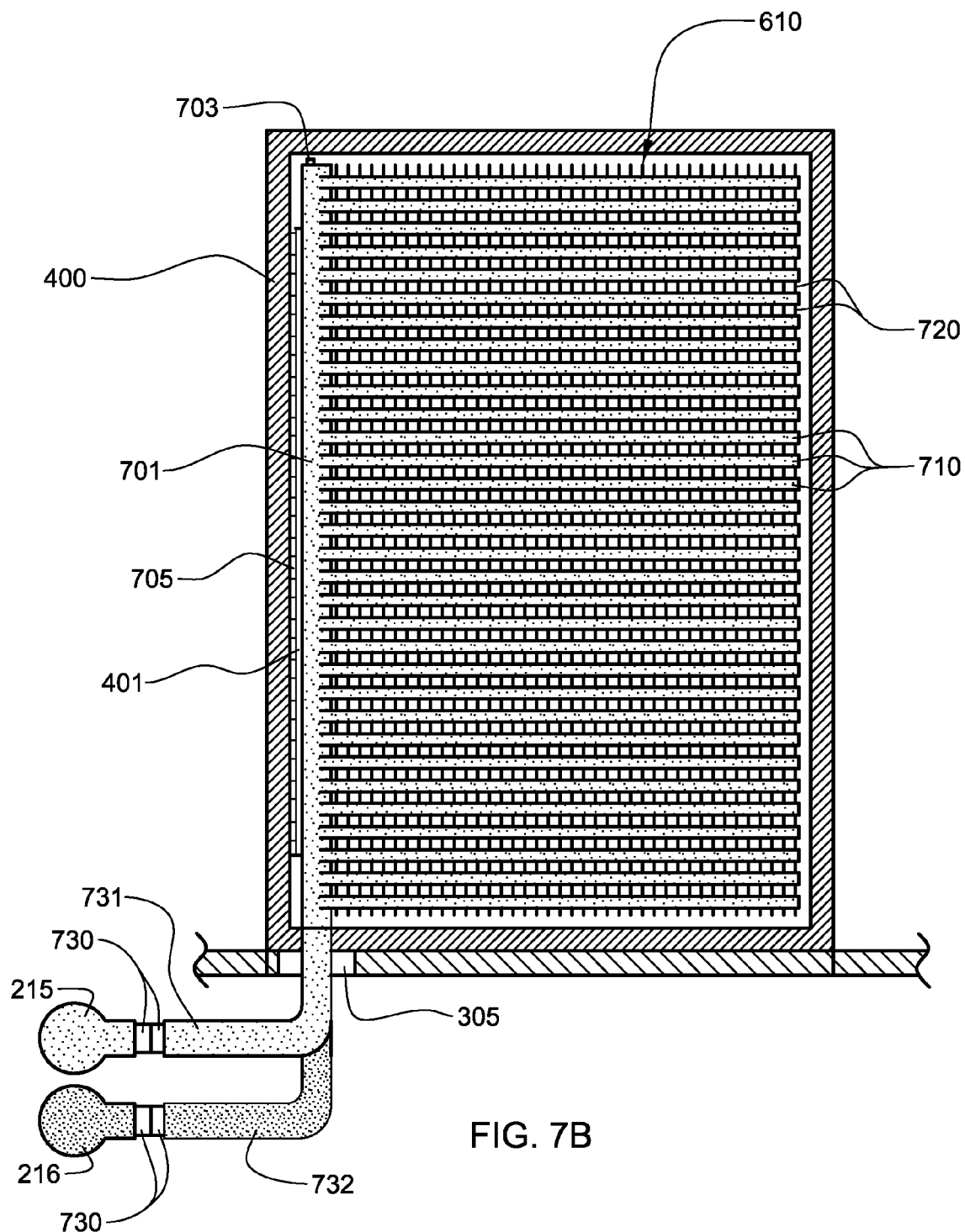
FIG. 7B is cross-sectional elevational view of the cooling station of FIG. 7A, taken along line 7B-7B, in accordance with an aspect of the present invention.
Figure 7C:
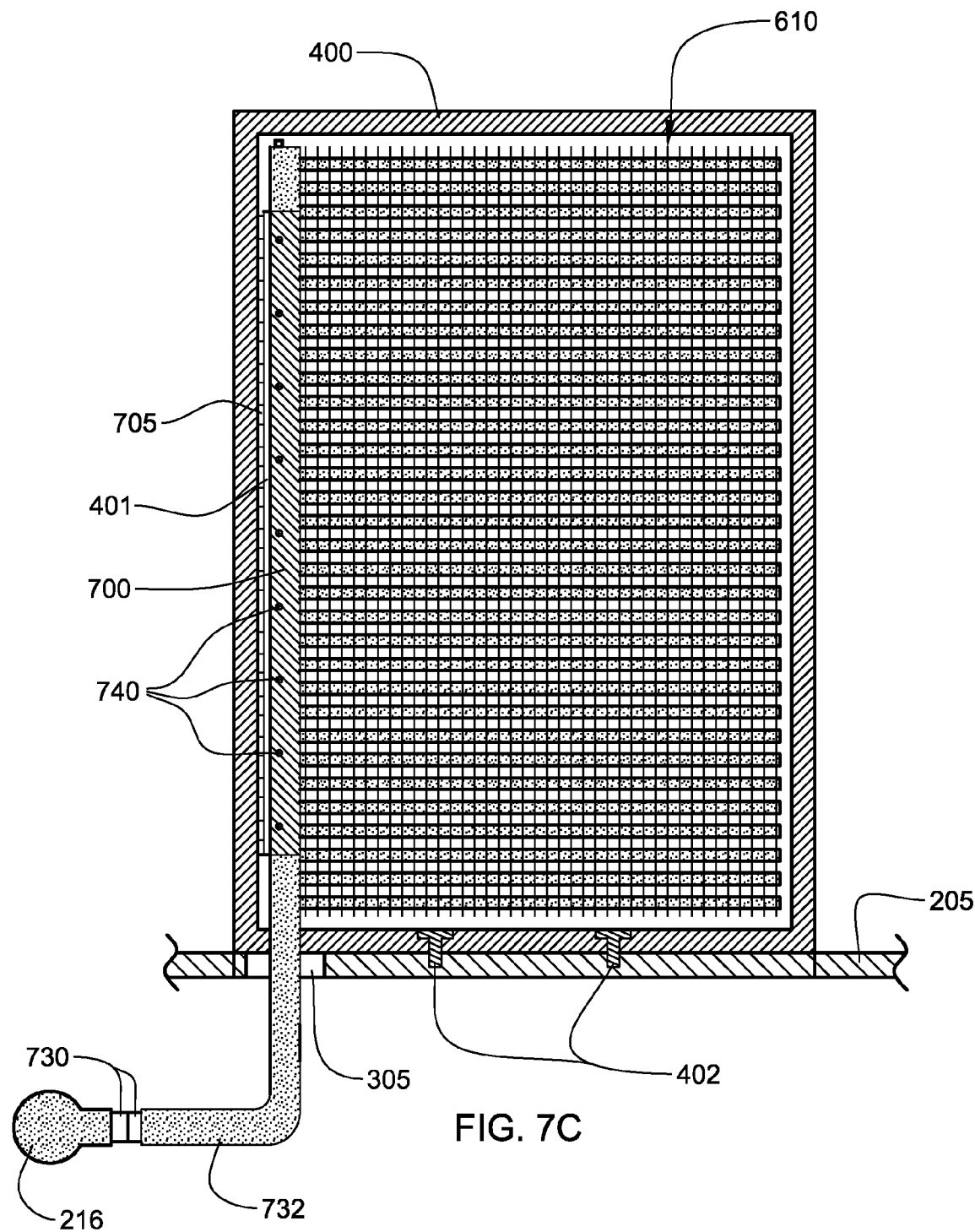
FIG. 7C is a cross-section elevational view of the cooling station of FIG. 7A, taken along line 7C-7C, in accordance with an aspect of the present invention.

FIGS. 7A-7C depict in greater detail one embodiment of a cooling station 600, in accordance with an aspect of the present invention. FIG. 7A is a cross-sectional plan view of cooling station 600, taken intermediate the top and bottom thereof. As illustrated, flap 401 is hingedly mounted 705 to frame structure 400. A plate 700 is attached (for example, by brazing or soldering) between an inlet plenum 701 and an outlet plenum 702 of the air-to-liquid heat exchange assembly 610. Inlet plenum 701 and outlet plenum 702 extend vertically within the cooling station and multiple horizontally-oriented heat exchange tube sections 710 are provided, each having a coolant channel with an inlet coupled to the inlet plenum and an outlet channel coupled to the outlet plenum. A plurality of vertically-extending rectangular fins 720 are attached to the horizontally-oriented heat exchange tube sections for facilitating transfer of heat from airflow 705 passing through the air-to-liquid heat exchange assembly to system coolant flowing within the heat exchanger. System coolant introduced through inlet plenum 701 initially flows through a front, cooler side of the horizontally-oriented heat exchange tube sections disposed closest to the air outlet side of one or more respective electronics racks. The system coolant gains heat as it passes through each U-shaped tube section, until being expelled through outlet plenum 702 on the back, warmer side of the tube sections.

FIG. 7B illustrates a cross-sectional elevational view of cooling station 600 of FIG. 7A, taken along line 7B-7B, and with the cooling station shown disposed on a floor through which flexible tubing 731, 732 passes. The cooling station again includes frame structure 400 with a hinged flap 401 to which the air-to-liquid heat exchange assembly 610 attaches. The vertically-oriented inlet plenum 701 is shown along with a plurality of horizontally-extending heat exchange tube sections 710 in fluidic communication therewith. Additionally, the vertically-aligned rectangular fins 720 are shown intermediate the tube sections in this cross-sectional view. Inlet plenum 701 includes a Schrader valve 703 at an upper end thereof to allow purging of air from the inlet plenum, and is coupled via tubing 731 and quick connect couplings 730 to a secondary supply header 215. Further, FIG. 7B illustrates tube 732, which is attached to a lower end of the outlet plenum, being connected via quick connect couplings 730 to a secondary return header 216.

Similarly, FIG. 7C is a cross-sectional elevational view of cooling station 600 of FIG. 7A, taken along line 7C-7C. In this view, the second, warmer side of the cooling station is illustrated. As shown, flap 401 is secured to hinge 705, which is attached to frame structure 400. Plate 700 is attached to the heat exchanger between the inlet and outlet plenums. Screws 740 hold plate 700 to hinged flap 401. Outlet plenum 702 also includes a Schrader valve at the top thereof to purge air therefrom, and a flexible tube 732 at a lower end thereof is coupled via quick connect couplings 730 to a secondary return header 216. In this view, bolts 402 are illustrated fastening frame structure 400 to, for example, raised floor 205 of the data center.

Figure 8:
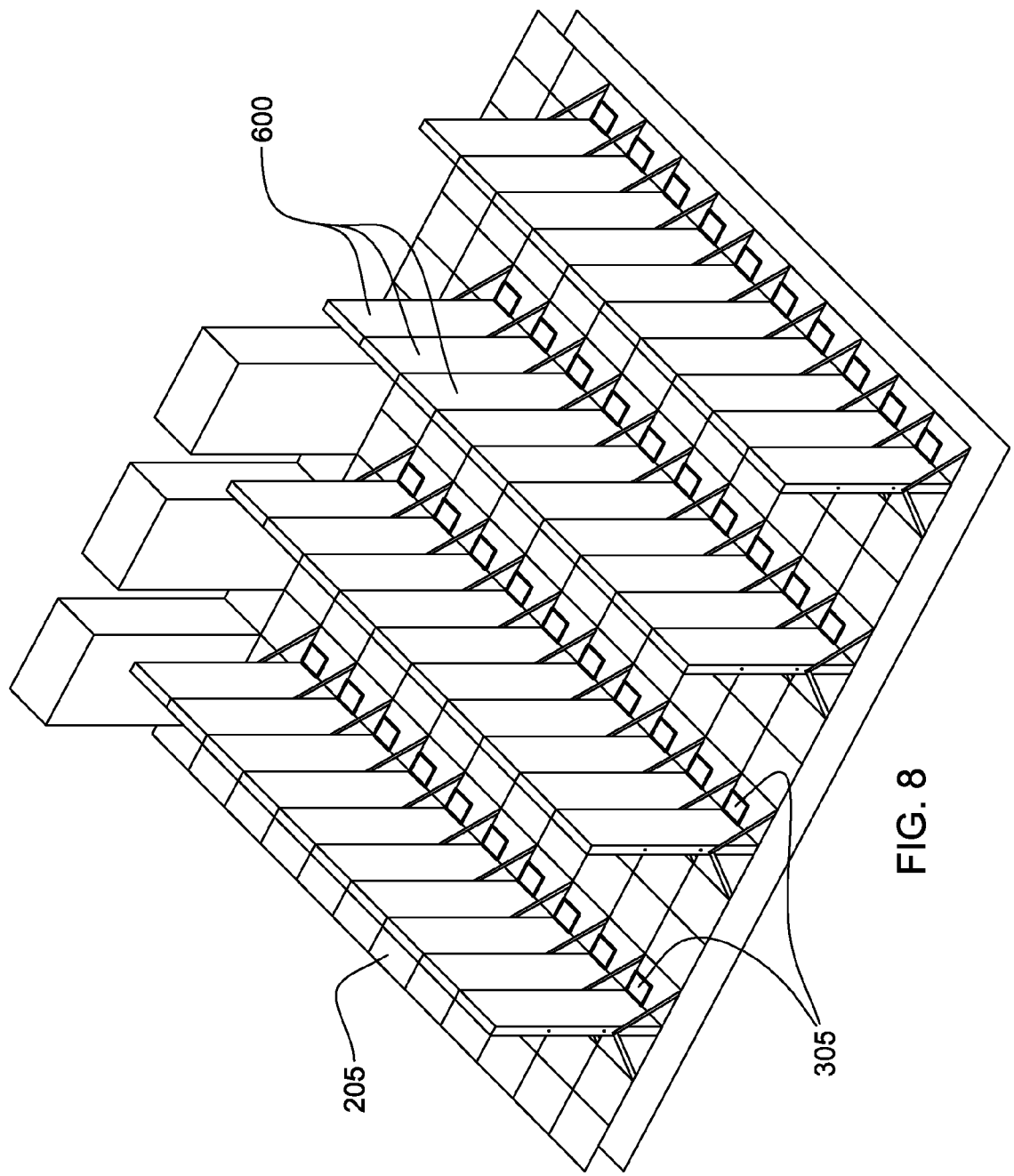
FIG. 8 depicts the liquid-cooled data center of FIG. 5 with a plurality of cooling stations disposed in multiple rows within the data center, in accordance with an aspect of the present invention.

FIG. 8 depicts one assembled embodiment of the cooling system disclosed herein. As illustrated, cooling stations 600 are aligned in multiple rows and secured to the data center floor 205. Openings 305 are disposed adjacent to each cooling station 600 to allow for plumbing access, as described above in connection with FIGS. 7A-7C, as well as cable access, for example, for an electronics rack to be disposed adjacent to the cooling station. The flexible hoses and cables are routed through the openings. With the array of cooling stations in place, a fully (in one embodiment) liquid-cooled data center is enabled.

Figure 9:
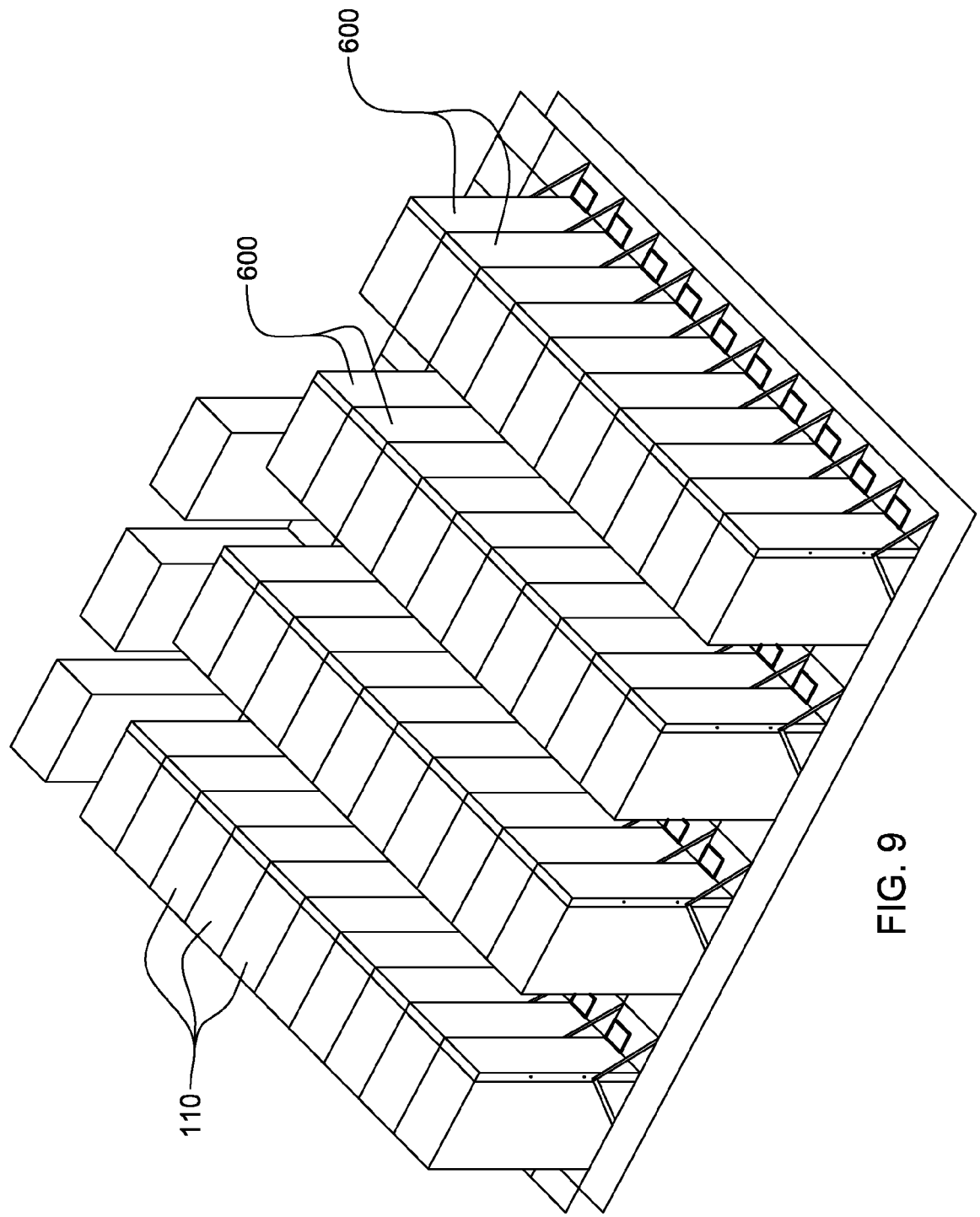
FIG. 9 depicts the liquid-cooled data center of FIG. 8 after a plurality of electronics racks have been positioned therein, with an air outlet side of each electronics rack disposed adjacent to a respective cooling station of the cooling system, in accordance with an aspect of the present invention.
Figure 10:
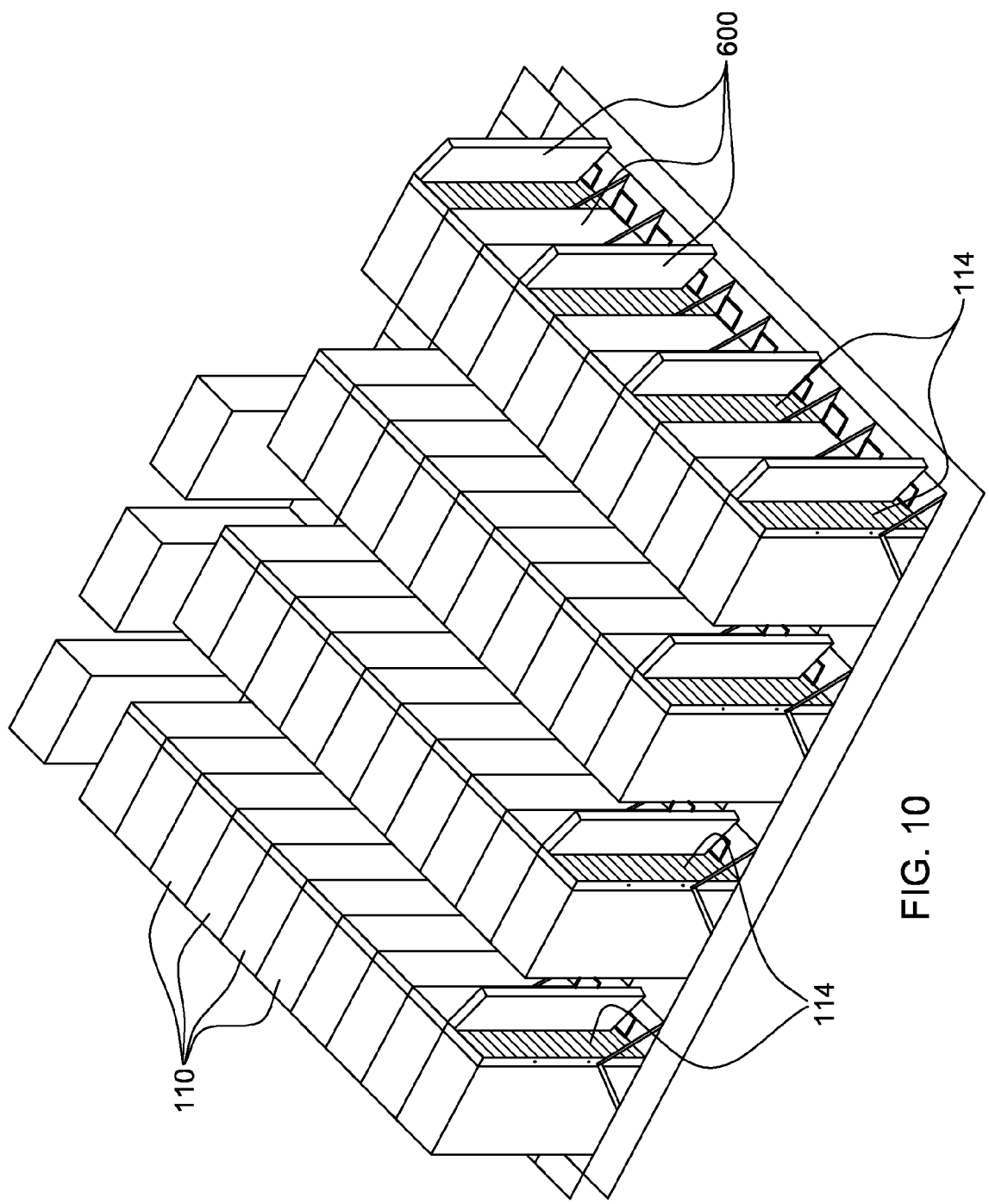
FIG. 10 depicts the liquid-cooled data center of FIG. 9, showing air-to-liquid heat exchange assemblies of multiple cooling stations pivoted open to allow access to the air outlet sides of respective electronics racks, in accordance with an aspect of the present invention.

FIG. 9 illustrates the liquid-cooled data center of FIG. 8, with multiple electronics racks 110, such as rack-mounted computer server units, disposed adjacent to the respective cooling stations 600 of the cooling system. The electronics racks are again air-cooled at the module and box level within the rack, and water-cooled at the rack level, that is, by the cooling stations of the data center. In this embodiment, the air outlet side of each electronics rack is positioned adjacent to a respective cooling station to facilitate removal of heat egressing from the electronics rack. Air moving devices (e.g., fans or blowers) within the electronics racks force air across the electronics rack from an air inlet side to an air outlet side thereof, thus cooling the heat generating electronics within the rack. This hot exhaust air from the electronics rack then passes through the respective air-to-liquid heat exchange assembly of the respective cooling station. The hot exhaust air is cooled by the cooling station and heat is rejected into the system coolant passing therethrough. The warm system coolant from the above-floor air-to-liquid heat exchange assemblies is returned to the respective coolant distribution units (CDUs) via the secondary and primary coolant headers described above. The system coolant is in turn cooled within the CDUs in liquid-to-liquid heat exchangers by the chilled facility coolant. The cooled system coolant is then returned via the supply headers to the cooling stations to continue the cooling circuit.

The air-to-liquid heat exchange assemblies of the cooling stations depicted in FIG. 9 can be thermally designed to extract, for example, one hundred percent of the rack heat load, while imposing only a small increase (~5-10%) in the air side impedance in the path of the rack air moving devices. In the data center design of FIG. 9, the rack air moving devices function to move air through both the server boxes (or nodes), as well as the adjacent cooling stations. Due to the small flow impedance burden imposed by a cooling station, the adjacent electronics rack can either absorb this penalty, or be designed to handle the additional pressure drop associated with the cooling station. Also, those skilled in the art should note that the liquid-cooled data center design of FIG. 9 does not require any conventional air-conditioning unit, thus eliminating one of the primary acoustic noise sources from the data center.

FIG. 10 illustrates the liquid-cooled data center of FIG. 9 with several air-to-liquid heat exchange assemblies of the cooling stations 600 pivoted open to access the air outlet sides 114 of the respective electronics racks 110. This allows ready access to, for example, the electronics within the racks from the air outlet sides thereof.

Figure 11:
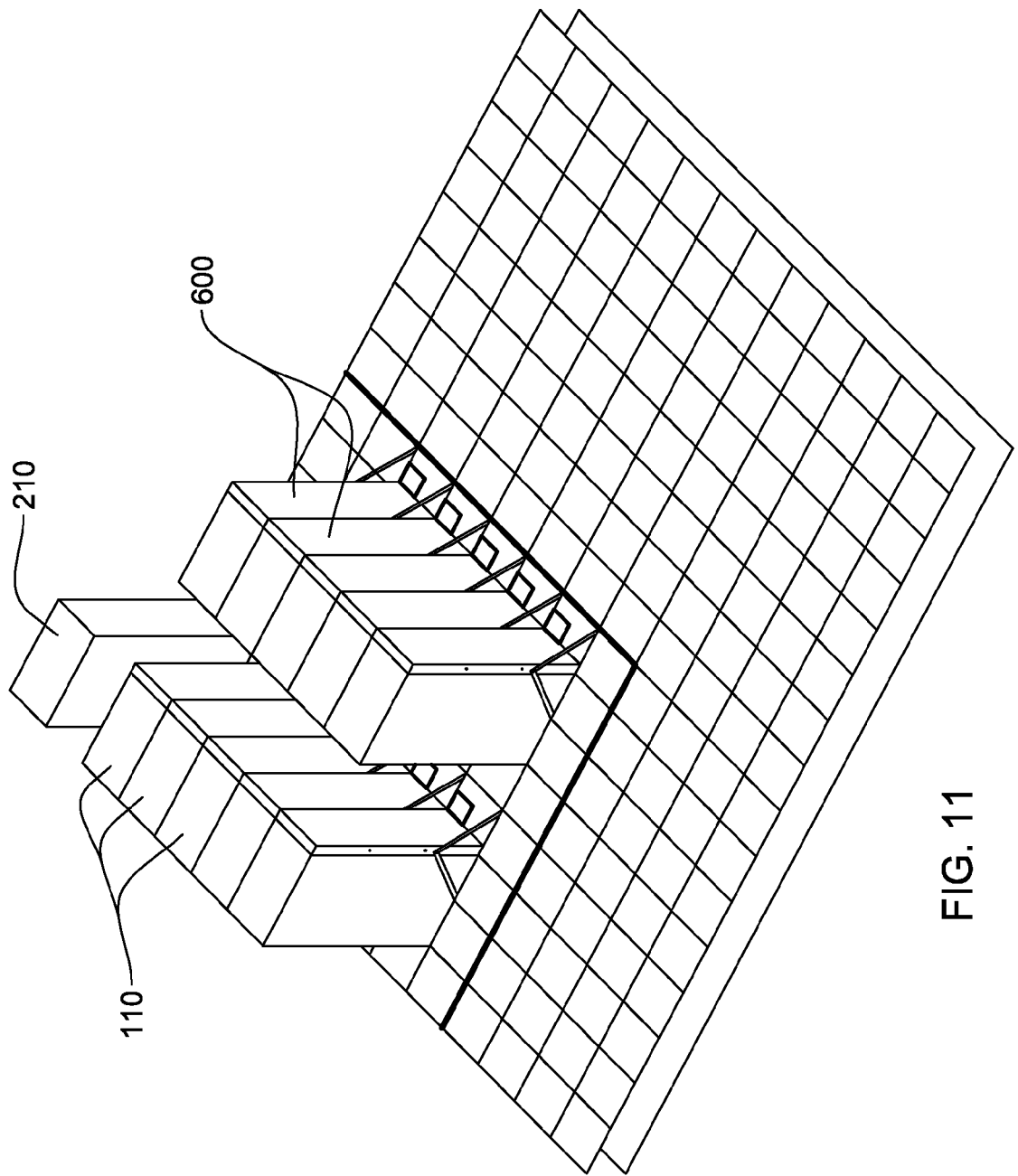
FIG. 11 depicts, for comparison against the raised floor layout of the air-cooled data center of FIG. 1, one embodiment of a raised floor layout of a liquid-cooled data center employing multiple cooling stations to cool ten electronics racks, in accordance with an aspect of the present invention.

FIG. 11 depicts (for comparison) the same number of electronics racks 110 disposed in two rows, as initially illustrated in the air-cooled data center embodiment of FIG. 1. In the liquid-cooled data center embodiment of FIG. 11, however, substantially smaller square footage is required. By way of example, and with reference to FIG. 1, consider a 768 square foot air-cooled data region having ten high performance racks of 30 kW power dissipation each, and three 90-100 kW (30-ton) air-conditioning units supplying about 30,000 cubic feet per minute (CFM) of chilled air at ~15° C. via 36 perforated tiles. Such a cluster has a floor heat flux of 390 watts per square foot, which somewhat approaches the air-cooling limit with respect to server density, and thus floor heat flux. Each of the 30-ton air-conditioning units consumes roughly 6.7 kW, thus making the total cooling power consumption approximately 20 kW for a 300 kW total server power. This translates to a modest coefficient of performance (COP) of 15. The COP is defined as the ratio of the heat load cooled by the cooling energy consumed.

In the liquid-cooled data center embodiment of FIG. 11, the same ten high performance electronics racks, dissipating 30 kW each, are assumed. The three air-conditioning units in the data center unit of FIG. 1 are replaced by one 12 kW coolant distribution unit. This translates to an excellent COP of 25. The floor space is also reduced by a factor of three, thus reducing the cost while also enabling a much higher server density. As noted, because of the removal of the air-conditioning units, the design of FIG. 11 will also be much quieter than the data center of FIG. 1. As a further comparison, the cooling cost of ownership (CCO) for the data center of FIG. 1 can be compared against the CCO for the data center of FIG. 11. The CCO is defined as the sum of the equipment cost and the energy operating costs for a fixed lifecycle. By way of example, a three year time period is assumed, with an energy cost of 0.1 $/kWh. Total cost of ownership (TCO) would be a combination of the CCO, the floor space cost, and several other components. It is expected while the CCO for both designs is nearly the same in the example provided, the TCO for the liquid-cooled data center design will be much lower in view of the considerably less floor space employed. Thus, for the same CCO as the air-cooled data center of FIG. 1, the liquid-cooled data center of FIG. 11 shows significant energy, server density and space improvement over the traditional design.

FIGS. 12A-12D depict an alternative embodiment of a cooling system for a liquid-cooled data center, in accordance with an aspect of the present invention. In this embodiment, the cooling stations 600', and in particular, the air-to-liquid heat exchangers assemblies, are assumed to be fixedly secured to the frame structures and hard-plumbed to the coolant supply and return headers. This configuration might be required when using a refrigerant as the coolant, for example, in a facility that does not allow water coolant to be employed. Alternatively, hard plumbing may be preferred by certain customers for reliability reasons. Hard plumbing of the air-to-liquid heat exchange assemblies to the under-floor supply and return headers means that the heat exchangers can not swing open to allow access or servicing at the air outlet side of the adjacent electronics racks since flexible hoses have been replaced by rigid pipes in this design.

Figure 12:
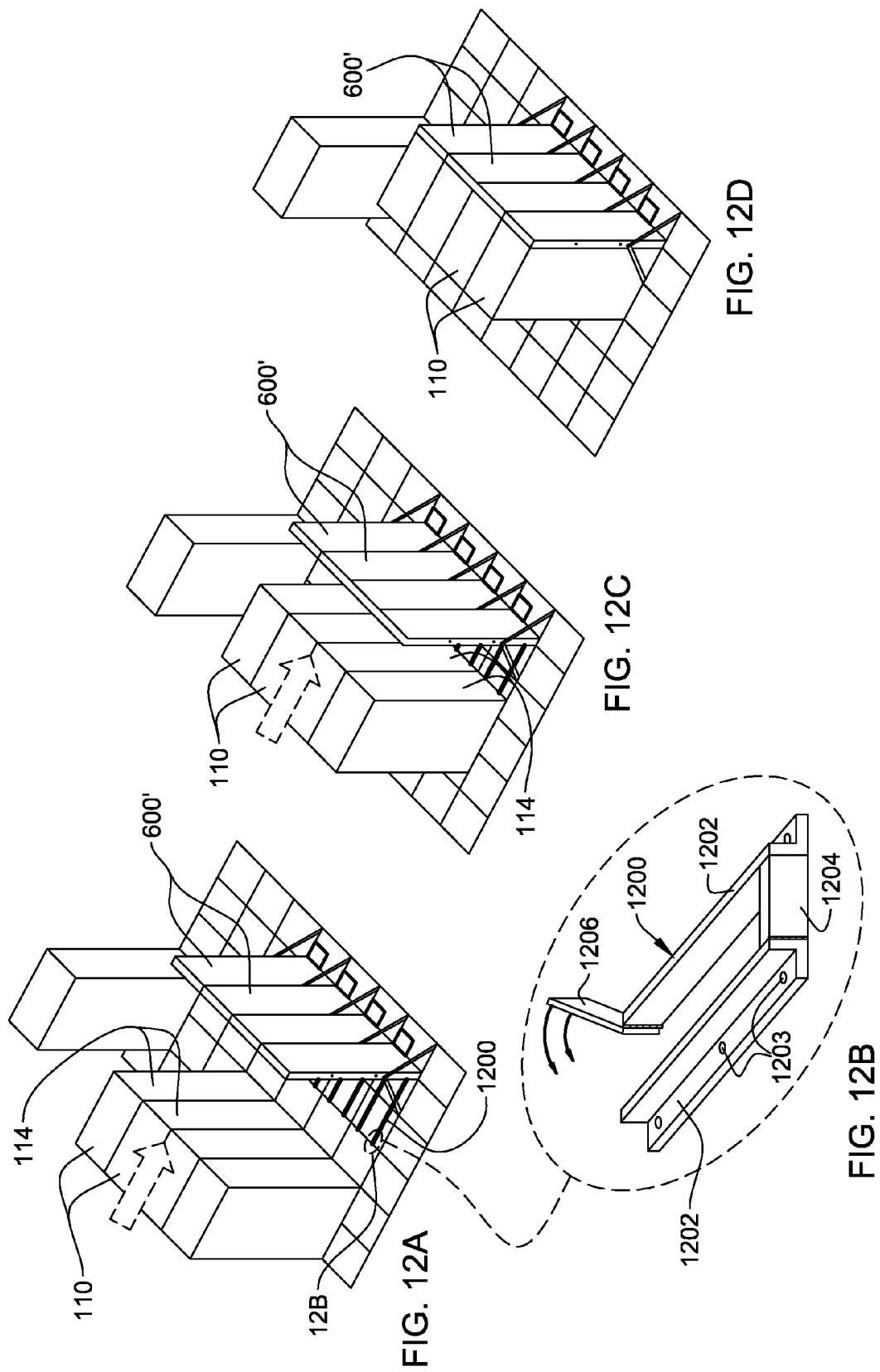
FIG. 12A partially depicts the data center layout of FIG. 10 during assembly thereof, wherein guide rail assemblies are attached to the floor adjacent to the cooling stations to facilitate disposition of the electronics racks in position relative to the cooling stations, in accordance with an aspect of the present invention.
FIG. 12B is an enlarged view of one embodiment of a guide rail assembly for directing and capturing one wheeled edge of an electronics rack when being positioned in front of a respective cooling station, in accordance with an aspect of the present invention.
FIG. 12C depicts the data center layout of FIG. 12A showing the electronics racks being moved into position in front of the respective cooling stations employing the guide rail assemblies, in accordance with an aspect of the present invention.
FIG. 12D depicts the data center layout of FIG. 12C, with the electronics racks retained in position relative to the cooling stations employing the guide rail assemblies, in accordance with an aspect of the present invention.

In FIG. 12A, guide rail assemblies 1200 are shown affixed to the floor. These guide rail assemblies engage wheels of the electronics racks to facilitate positioning of the electronics rack in alignment with one or more of the respective cooling stations. A detailed view of one guide rail assembly 1200 is illustrated in FIG. 12B. As shown, each rail assembly includes two guiding rails 1202 that are bolted 1203 to the floor and are connected by two hinged flaps 1204, 1206, which also act as stoppers. With the rear stopper 1204 closed and the front stopper 1206 open, the electronics racks are rolled towards the set of rail assemblies until the rack wheels for each rack enter the two paths created by a pair of guide rails assemblies disposed in front of the respective cooling station. Once engaged, the electronics racks roll into position being guided by the rail assemblies. After moving the electronics racks into correct position, the front stoppers are locked, thus trapping the respective electronics racks in their proper location. The stoppers 1204, 1206 can be spring-loaded mechanisms or be manually closed.

FIG. 12C illustrates the electronics racks 110 being moved into position with the air outlet sides 114 thereof disposed facing the cooling stations 600'. Proper alignment of the electronics racks to the cooling stations is achieved using the guide rail assemblies. FIG. 12D illustrates the fully engaged position where the electronics racks 110 are disposed adjacent to the cooling stations 600'.

Figure 13:
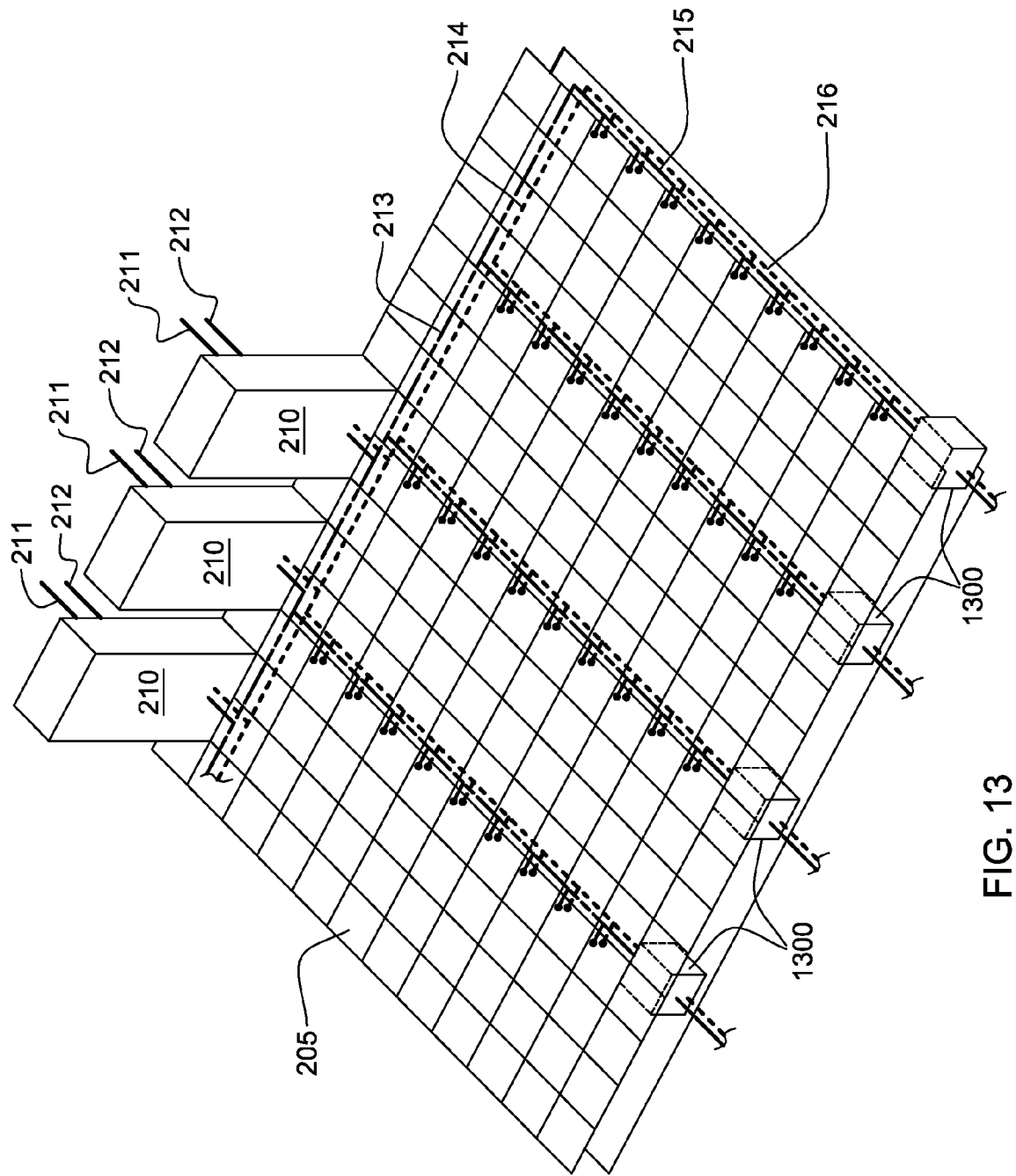
FIG. 13 depicts an enhanced embodiment of the liquid-cooled data center of FIG. 2, wherein booster pumping units are utilized to facilitate movement of coolant through the secondary supply and return headers, in accordance with an aspect of the present invention.

The primary and secondary system coolant headers may form a complicated flow passage for the coolant. This has the potential to create an imbalanced flow distribution throughout the coolant grid under the floor and result in a large variation in system coolant flow rate. This in turn can lead to fluctuation and unpredictability in the thermal performance of the heat exchangers. To address this issue, booster pumping units (BPUs) can be employed as illustrated in FIG. 13. Each BPU 1300 may include one or more coolant pumps, a reservoir tank, a filter, and related control electronics. While these BPUs can address poor flow distribution, they can also potentially be employed to force different coolant flow rates in different parts of the data center. Thus, it is possible to intentionally control and manage system coolant flow rates in different parts of the liquid-cooled data center. The BPUs 1300 can have flexible hoses at the four ports with quick connect couplings, or may be hard plumbed into strategic locations on the data center floor. Further, the control instrumentation for these BPUs can be such that they allow a data center operator to remotely change the control parameters and manage the data center system coolant flow rates efficiently.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling system comprising:
   at least one cooling station for facilitating cooling of at least one electronics rack of a data center, each electronics rack of the at least one electronics rack comprising an air inlet side and an air outlet side, the air inlet and air outlet sides respectively enabling ingress and egress of external air, each cooling station of the at least one cooling station being separate and freestanding from at least one respective electronics rack when the at least one electronics rack is in operative position adjacent thereto, and being configured for disposition of the air outlet side of the at least one respective electronics rack adjacent thereto for cooling egressing air from the at least one respective electronics rack, and each cooling station comprising:
      a frame structure separate and freestanding from the at least one electronics rack;
      an air-to-liquid heat exchange assembly supported by the frame structure, the air-to-liquid heat exchange assembly including an inlet configured to couple to a coolant supply line and an outlet configured to couple to a coolant return line to facilitate passage of coolant there through;
      wherein the air-to-liquid heat exchange assembly is sized to cool egressing air from the air outlet side of the at least one respective electronics rack before being expelled into the data center; and
      wherein the air-to-liquid heat exchange assembly is hingedly mounted to the frame structure to allow for access to the air outlet side of the at least one respective electronics rack when the at least one respective electronics rack is disposed in operative position with the air outlet side thereof adjacent to the cooling station for cooling egressing air therefrom before being expelled into the data center.

2. The cooling system of claim 1, wherein the air-to-liquid heat exchange assembly is sized to substantially cover the air outlet side of the at least one respective electronics rack, and wherein substantially all air egressing from the air outlet side of the at least one respective electronics rack passes through the air-to-liquid head exchange assembly for extraction of heat therefrom before being expelled into the data center.

3. The cooling system of claim 1, wherein the frame structure is sized to a respective electronics rack and the air-to-liquid heat exchange assembly of the at least one cooling station is sized to substantially cover the air outlet side of the respective electronics rack to cool egressing air therefrom before being expelled into the data center.

4. The cooling system of claim 1, wherein the air-to-liquid heat exchange assembly further comprises at least one air-to-liquid heat exchanger having an inlet plenum and an outlet plenum disposed adjacent to an edge of the air-to-liquid heat exchange assembly hingedly mounted to the frame structure, and wherein the inlet plenum and the outlet plenum are each in fluid communication with a respective connect coupling of the air-to-liquid heat exchange assembly, the respective connect couplings allowing for connections to the coolant supply line and the coolant return line to facilitate passage of coolant through the at least one air-to-liquid heat exchanger, and wherein the air-to-liquid heat exchanger further comprises multiple horizontally-oriented heat exchange tube sections, each heat exchange tube section comprising a coolant channel having an inlet and an outlet, each coolant channel inlet being coupled to the inlet plenum and each coolant channel outlet being coupled to the outlet plenum, and wherein the air-to-liquid heat exchanger further comprises a plurality of fins extending from the heat exchange tube sections.

5. The cooling system of claim 1, further comprising at least one guide rail assembly disposed adjacent to the at least one cooling station and secured to a floor of the data center for facilitating guiding of the at least one electronics rack into operative position with the air outlet side thereof disposed adjacent to the at least one cooling station.

6. A data center comprising:
   multiple electronics racks, each electronics rack comprising an air inlet side and an air outlet side, the air inlet and air outlet sides respectively enabling ingress and egress of external air; and
   a cooling system for cooling the multiple electronics racks, the cooling system comprising multiple cooling stations, the multiple cooling stations being separate and freestanding from the multiple electronics racks, wherein the multiple electronics racks are disposed with the air outlet sides thereof adjacent to the multiple cooling stations for facilitating cooling of egressing air therefrom, and wherein each cooling station further comprises:
      a frame structure separate and freestanding from at least one respective electronics rack;
      an air-to-liquid heat exchange assembly supported by the frame structure, the air-to-liquid heat exchange assembly including an inlet coupled to a coolant supply line and an outlet coupled to a coolant return line for facilitating passage of coolant therethrough;
      wherein the air-to-liquid heat exchange assembly substantially covers the air outlet side of at least one respective electronics rack, with air egressing therefrom passing through the air-to-liquid heat exchange assembly before being expelled into the data enter environment; and
      wherein the air-to-liquid heat exchange assembly of at least one cooling station of the multiple cooling stations is hingedly mounted to the frame structure thereof to allow access to the air outlet side of at least one respective electronics rack.

7. The data center of claim 6, further comprising at least one coolant distribution unit, the at least one coolant distribution unit comprising at least one liquid-to-liquid heat exchange assembly, the at least one liquid-to-liquid heat exchange assembly providing cooled system coolant to the multiple cooling stations and expelling heat from system coolant returning from the multiple cooling stations to facility coolant of the data center.

8. The data center of claim 7, wherein the multiple cooling stations are aligned in at least two rows, and wherein the cooling system further comprises a primary supply header and at least two secondary supply headers for supplying cooled system coolant to the multiple cooling stations from the at least one coolant distribution unit, and a primary return header and at least two secondary return headers for returning system coolant from the multiple cooling stations to the at least one coolant distribution unit.

9. The data center of claim 8, further comprising a raised floor, wherein the multiple electronics racks and multiple cooling stations are disposed on the raised floor, and the primary supply header, at least two secondary supply headers, primary return header and at least two secondary return headers are disposed beneath the raised floor, and wherein the multiple cooling stations are in fluidic communication with respective secondary supply and return headers via hoses connected between the inlet and outlet plenums thereof and connect couplings coupled to the respective secondary supply and return headers.

10. The data center of claim 6, wherein the multiple cooling stations of the cooling system absorb heat dissipated by the multiple electronics racks without employing an air-conditioning unit within the data center.

11. The data center of claim 6, wherein the air inlet sides of the multiple electronics racks of the data center face a first common direction and the air outlet sides of the multiple electronics racks face a second common direction, and wherein the air outlet sides of the multiple electronics racks are in opposing relation to the air-to-liquid heat exchange assemblies of the multiple cooling stations.

12. The data center of claim 11, wherein air egressing from at least one row of electronics racks and cooling stations flows in a direction towards the air inlet sides of electronics racks in at least one other row of the multiple electronics racks.

13. The data center of claim 6, wherein the multiple cooling stations are secured to a floor of the data center and one or more struts are provided securing the frame structures thereof to the floor of the data center.

14. A data center comprising:
multiple electronics racks, each electronics rack comprising an air inlet side and an air outlet side, the air inlet and air outlet sides respectively enabling ingress and egress of external air; and
a cooling system for cooling the multiple electronics racks, the cooling system comprising multiple cooling stations, the multiple cooling stations being separate and freestanding from the multiple electronics racks, wherein the multiple electronics racks are disposed with the air outlet sides thereof adjacent to the multiple cooling stations for facilitating cooling of egressing air therefrom, and wherein each cooling station further comprises:
a frame structure separate and freestanding from at least one respective electronics rack;
an air-to-liquid heat exchange assembly supported by the frame structure, the air-to-liquid heat exchange assembly including an inlet coupled to a coolant supply line and an outlet coupled to a coolant return line for facilitating passage of coolant therethrough; and
wherein the air-to-liquid heat exchange assembly substantially covers the air outlet side of at least one respective electronics rack, with air egressing therefrom passing through the air-to-liquid heat exchange assembly before being expelled into the data enter environment
wherein the air-to-liquid heat exchange assemblies of the multiple cooling stations further comprise at least one air-to-liquid heat exchanger within each cooling station, the at least one air-to-liquid heat exchanger comprising a vertically-oriented inlet plenum and a vertically-oriented outlet plenum disposed adjacent to an edge thereof hingedly mounted to the frame structure, and wherein the vertically-oriented inlet plenum and the vertically-oriented outlet plenum are each in fluid communication with a respective connect coupling, the respective connect couplings connecting the coolant supply line and the coolant return line to the vertically-oriented inlet plenum and vertically-oriented outlet plenum, respectively, to facilitate the passage of coolant through the at least one air-to-liquid heat exchanger, and wherein the air-to-liquid heat exchanger further comprises multiple horizontally-oriented heat exchange tube sections, each heat horizontally-oriented heat exchange tube section comprising a coolant channel having an inlet and an outlet, each coolant channel inlet being coupled to the inlet plenum and each coolant channel outlet being coupled to the outlet plenum, and wherein the at least one air-to-liquid heat exchanger further comprises a plurality of fins extending vertically from the horizontally-oriented heat exchange tube sections.

* * * * *